United States Patent [19]

Collings

[11] Patent Number: 4,571,507

[45] Date of Patent: Feb. 18, 1986

[54] SUCCESSIVE APPROXIMATION ANALOG-TO-DIGITAL CONVERTER

[75] Inventor: Jerry M. Collings, Santa Clara, Calif.

[73] Assignee: Hybrid Systems Corporation, Billerica, Mass.

[21] Appl. No.: 377,307

[22] Filed: May 12, 1982

[51] Int. Cl.[4] .................... H03K 5/00; H03K 5/153
[52] U.S. Cl. ................................ 307/350; 307/261; 307/360; 307/296 R
[58] Field of Search ............... 307/296 R, 261, 350, 307/360

[56] References Cited

U.S. PATENT DOCUMENTS 4,147,943 4/1979 Peterson ........................ 307/355

Primary Examiner—John Zazworsky
Attorney, Agent, or Firm—Weingarten, Schurgin, Gagnebin & Hayes

[57] ABSTRACT

A successive approximation analog-to-digital converter utilizes an improved high-gain current comparator having a zero input impedance characteristic in combination with an equal current digital-to-analog converter. The zero input impedance comparator permits the use of low power C-MOS switching circuitry by leading the output of the digital-to-analog converter to the zero impedance input of the comparator, thereby overcoming the problem of decreased switching speed associated with high capacitance C-MOS outputs. The zero impedance current comparator includes an improved current-to-voltage converter having an overdrive shunt circuit to reduce quiescent current and to permit higher value load resistors for better gain; and cascaded current cells to provide increased gain.

3 Claims, 13 Drawing Figures

SUCCESSIVE APPROXIMATION ANALOG-TO-DIGITAL CONVERTER

FIELD OF THE INVENTION

This invention relates to analog-to-digital converters and more particularly to an improved successive approximation analog-to-digital converter characterized by low current drain, high speed and increased accuracy.

BACKGROUND OF THE INVENTION

Fast high resolution analog-to-digital (A/D) converters are most often realized utilizing successive approximation techniques in which a successive approximation register is clocked so as to provide an increasing or decreasing series of binary numbers representing predetermined weights. Signals representing these numbers are coupled to the switching elements of a digital-to-analog converter (DAC) which converts the numbers into analog voltages or currents against which an analog input signal is compared. The magnitude of the analog input signal is compared with the weightings provided by the DAC starting with the most significant bit (MSB) to ascertain whether the analog signal is above or below the level established by the bit. If above, the state of the corresponding binary element of the successive approximation register is not changed. If below, the state of the binary element is reversed. After cycling through, for instance, 12 bits representing weightings of 2048, 1024, 512, 256, 128, 64, 32, 16, 8, 4 and 2, 1 the sum equalling 4095, the cycling is inhibited and the state of the successive approximation register is read out as the digital approximation of the analog signal. Thus, for instance, for an amplitude of 30, the final state of the register would be 000000011111=31.

To achieve the required accuracy, speed and stability, high performance linear and digital circuitry is needed. The discipline surrounding linear circuits and digital techniques often dictate that a hybrid approach to the construction of an analog-to-digital converter will yield the best, most economical performance. In the past, most of successive approximation analog-to-digital converters have worked in the voltage domain in which so-called "R, 2R" resistor ladders are utilized to produce binary weighted voltages in accordance with the output state of the successive approximation register. In general, digital-to-analog converters utilizing R, 2R ladders have also utilized bipolar switching circuits so as to switch in resistors corresponding to the digital input code from the successive approximation register. Bipolar switching circuitry is utilized because it is relatively fast, the speed of the bipolar switching circuitry being basically a function of the relatively low output capacitances involved. Conventional comparator circuits operating in the voltage domain are compatible with the bipolar circuits and, in general, are compatible with the speed associated with bipolar switching arrangements.

There are, however, problems associated with the aforementioned conventional successive approximation analog-to-digital converter which center around the high current drain associated with bipolar switching. Moreover, R, 2R ladders have linearity characteristics which are highly sensitive to the accuracy of the resistor values. When R, 2R ladders are utilized, the accuracy of the conversion is much more sensitive to the individual resistor values than is an equal current digital-to-analog converter in which a resistor network is provided to generate equal currents. These currents when summed, provide for current steps which increase with increases in the binary number provided by the successive approximation register. Not only are there linearity problems associated with the R, 2R networks, but also switching errors greatly affect the d.c. stability of the output from such a digital-to-analog converter.

In addition to problems with linearity, the aforementioned current drain is excessive when utilizing bipolar switching elements. In an effort to decrease the power consumption of such a circuit, complementary metal oxide semiconductor (C-MOS) devices may be utilized in the switching circuits for the digital-to-analog converter. However C-MOS switching circuits, while providing order of magnitude advantage in decreased power consumption, have high output capacitances. High output capacitance severely limits the speed with which the analog-to-digital conversion can proceed, and thus the benefits of C-MOS technology have not been available for use in analog-to-digital conversion. Moreover, the inability to utilize C-MOS technology due to speed requirements has, in general, prohibited the advantages of lower switching errors and higher signal-to-noise ratios associated with C-MOS switching circuits when utilized in combination with equal current digital-to-analog converters.

Another reason C-MOS circuitry has not been utilized for analog-to-digital converters has been the problem of low gain for the required current comparator circuitry. Gain problems associated with current comparators generally center around the current-to-voltage converter utilized ahead of a conventional voltage comparator, with the gain of the current-to-voltage converter stage in general causing attenuation. The reason that the gain through the conventional current-to-voltage converter is generally less than one, is a result of the high quiescent bias current necessary to maintain the conducting state of the transistors utilized in the converter when the converter is subjected to overcurrents. High quiescent bias necessitates the utilization of relatively low-valued load resistors which in turn reduces the gain of the comparator.

Moreover, with respect to d.c. stability, since all digital-to-analog converters require highly stable reference supplies, it is often only with difficulty that tight tolerances can be maintained through the utilization of conventional reference supplies having conventional inverters.

Finally, inexpensive yet accurate clocking systems which are at the same time low-power, have not been available for the clocking and control of analog-to-digital converters. With the exception of crystal controlled clocks which are prohibitively expensive, most C-MOS clocking circuits have clock frequencies which are highly dependent on variations in device thresholds.

As a result, high accuracy, high linearity, stable, low power successive approximation monolithic analog-to-digital converters have not previously been available.

SUMMARY OF THE INVENTION

In the subject invention, a successive approximation analog-to-digital converter is provided which utilizes an equal current digital-to-analog converter in combination with a high-gain current comparator having a zero input impedance characteristic. The reference supply for the system includes a stabilized high-gain inverter which obtains its gain through the utilization of a single amplification stage in combination with a circuit for bootstrapping the active load utilized in the single amplification stage. A system clock is provided, the frequency of which is independent of temperature through the utilization of an integrator in combination with a Schmidtt trigger having a sliding hysteresis window.

The zero input impedance characteristic of the high-gain current comparator permits the utilization of low current drain C-MOS switching circuits for the digital-to-analog converter, since the characteristic high capacitance output for C-MOS devices has no affect on speed when the comparator is operated in the current domain.

In one embodiment, an improved current-to-voltage converter is provided through the utilization of overcurrent shunt transistors which shunt overcurrents directly to the minus supply voltage. With the utilization of overcurrent shunt transistors, the bias current can be reduced from a normal two milliamps to five microamps. The use of overcurrent shunt transistors also permits the utilization of high-valued load resistors thereby to provide the current-to-voltage converter with a higher gain.

While the provision of a high gain current-to-voltage converter permits the utilization of conventional voltage comparator circuits, these circuits are, in general, of a relatively complex nature and have a high parts count. In a further embodiment, cascaded current cells are provided to increase the gain of the converter further without reducing speed, thereby permitting considerable simplification in the voltage comparator stage. With amplification in the current mode, the necessity of multiple voltage amplification stages is eliminated. This eliminates the multiple time constants associated with multiple voltage amplification stages. By eliminating the necessity of multiple voltage amplification stages and the cumulative large time constant, the gain of the comparator is increased without a concomitant decrease in speed. In the subject invention, gain equivalent to the use of multiple voltage amplification stages is achieved through the use of cascaded current cells which have only one corresponding time constant.

As described above, the subject analog-to-digital converter operates with an equal current digital-to-analog converter. In one embodiment, the digital-to-analog converter includes C-MOS switching elements for low current drain. The combination of the equal current C-MOS DAC and the aforementioned improved current-to-voltage comparator provide for high linearity, high speed and reduced power consumption. The differences between the equal current DAC and the conventional R, 2R DAC are first that it includes a different type of resistor network which is one in which resistors, each having the same weight, are connected in parallel by corresponding switches between a reference voltage and an output bus. Put another way, the resistor network generates equal currents at the output nodes corresponding to the bits. This is unlike the R, 2R network which produces binary weighted currents.

Secondly, the binary input code is converted to a specialized code for the actuation of the switches for the network. Here the binary input code is converted into a code in which an increment in the binary number results in the adding in parallel of an additional resistor or resistors to the remainder of the resistors already connected between the reference source and the output bus.

This system has two advantages. The first advantage is that no one resistor contributes more than its fractional part of the total resistor network to error. Secondly, because of the decoding of the binary input code and the manner in which the resistor elements are added in parallel, there is no situation in which one switch is to be turned ON while another is to be "simultaneously" turned OFF for any given input code increment. Thus, in going from one binary number to the next higher or lower binary number switches are either turned ON or turned OFF, but there is never a situation in which for a given transition, some switches are turned ON and some switches are turned OFF. As can be seen, no "glitch" occurs because all switches switch in the same direction for any increment in input code.

In a further aspect, DAC resistor trimming is accomplished by the interposition of small trimming resistors between the main resistive elements. When equallizing the currents starting from the least significant bit (LSB) resistor, any current imbalance due to over-trimming of a main resistor can be compensated by trimming a corresponding trimming resistor to make all lower significant bit currents equal to that produced by the over-trimmed main resistor.

What is therefore provided is an exceptionally low power, high accuracy, "glitch"-free, high speed and exceptionally stable analog-to-digital converter, with the resultant characteristics being a function not only of the improved characteristics of the components, but also a result of the combination of the components into the total analog-to-digital converter.

BRIEF DESCRIPTION OF THE DRAWINGS

These and other features of the invention will be better understood in connection with the following detailed description taken in conjunction with the drawings of which.

DETAILED DESCRIPTION

Figure 1:
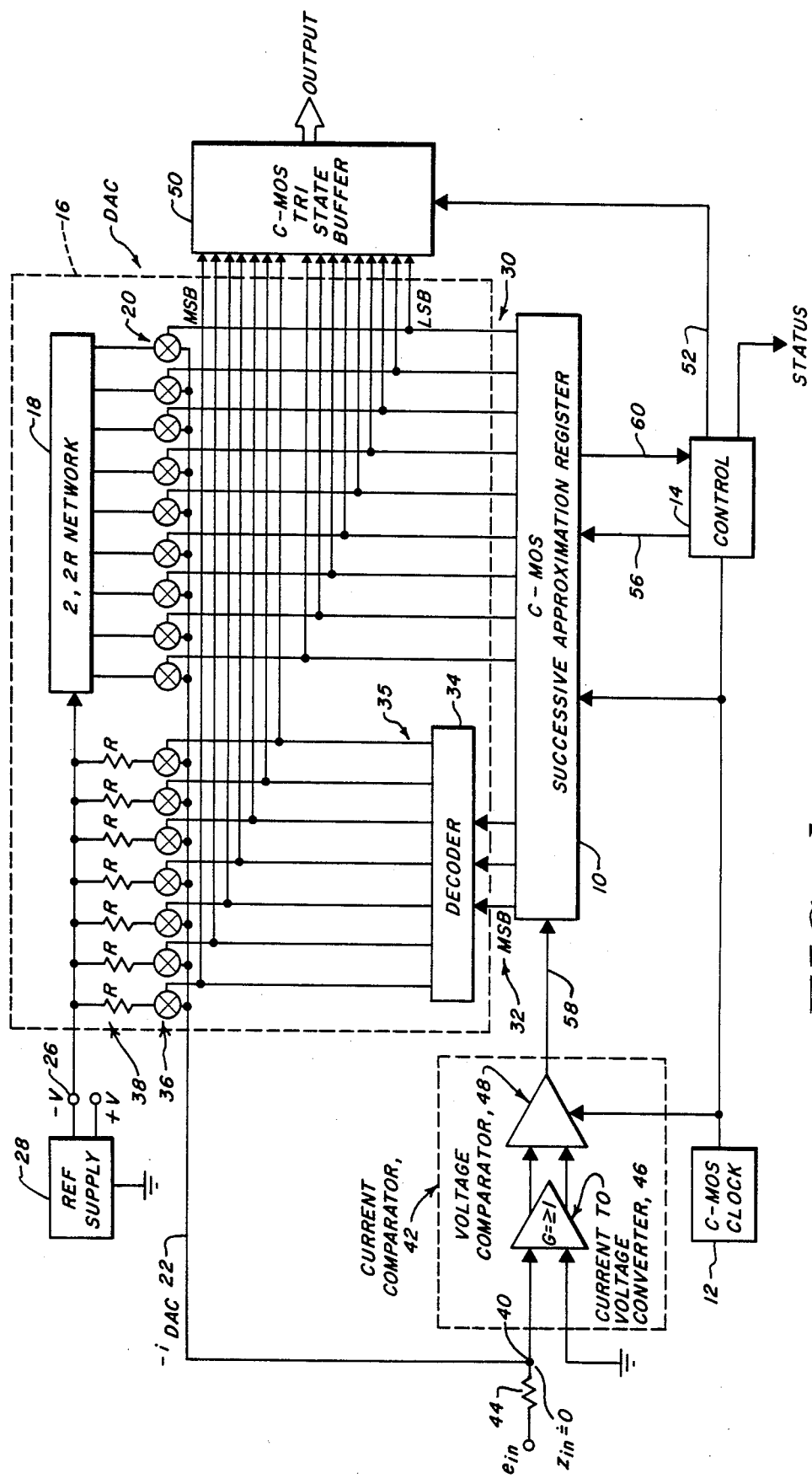
FIG. 1 is a block diagram of the subject analog-to-digital conversion system illustrating the combination of a high accuracy C-MOS DAC, a high gain zero input impedance current comparator, a C-MOS successive approximation register, a C-MOS clock, a C-MOS tri state buffer, and a C-MOS decoding network.

In order to provide a low current drain, high speed, increased accuracy successive approximation analog-to-digital converter, and referring now to FIG. 1, the analog-to-digital converter includes a successive approximation register 10 which is clocked by a clock 12 and is under the control of a control unit 14. The outputs of the successive approximation register 10 are applied to a digital-to-analog converter generally indicated as enclosed by dotted box 16 which, in one embodiment, includes two networks. For the less significant bits, an R, 2R network 18 is provided which is utilized to generate binary currents applied through a series of switches 20 to an output bus 22. One side of the R, 2R network is coupled via a bus 24 to the negative output terminal 26 of a reference supply 28. Actuation for the switches results from the application of signals on lines generally indicated at 30 in accordance with the lesser significant bits of the successive approximation register. The most significant bits here illustrated at 32 are coupled to a decoding unit or decoder 34, the outputs of which on lines 35 are utilized to drive a series of switches 36 so as to couple equal weighted resistive elements generally indicated at 38 between reference bus 24 and output bus 22. By virtue of current flowing through the resistors of the equal weighted digital-to-analog converter, the most significant bits appear as successively diminished currents on output bus 22.

Output bus 22 is coupled at an input node 40 of a current comparator 42, to which is also coupled an input signal $e_{in}$. $e_{in}$ is applied through a resistor 44 such that the current generated by the digital-to-analog converter is compared to that generated through resistor 44. As will be seen, it is a characteristic of a current-to-voltage converter 46 within current comparator 42, that input node 40 represents a zero input impedance. The output of current-to-voltage converter 46 is coupled to a voltage comparator 48, such as National Semiconductor Model 311, the output of which is applied to successive approximation register 10, such as Model 2504 manufactured by National Semiconductor, Inc.

Additionally, the outputs of decoder 34 and the lesser significant bit outputs of the successive approximation register are coupled to a tri state buffer 50, such as Motorola Model 74LS574, which is actuated by a control signal applied to line 52 from control unit 14 to gate out the signals on lines 30 and 32.

In order to reduce the current drain of a successive approximation analog-to-digital converter, all switching elements within switching circuits 20 and 36 are C-MOS circuits. Moreover, the successive approximation register is manufactured from C-MOS components, as is the clock and the tri state buffer.

The utilization of C-MOS technology reduces the current drain of the entire system and is useable, as will be explained, because of the provision of a zero input impedance node at the comparator circuit.

In operation, control unit 14 actuates the successive approximation register over a line 56 to begin cycling down through a series of numbers representing predetermined weights starting from the MSB. The outputs of the successive approximation register are either decoded or utilized directly to actuate switching elements 20 and 36, thereby to cause successive changes in the current, $-i_{DAC}$, applied to bus 22. $i_{DAC}$ is compared to the current through resistor 44, $i_{in}$, with the resulting difference current at node 40 being converted to a voltage and compared at voltage comparator 48 to a level corresponding to a predetermined difference between the DAC current and $i_{in}$. If the difference is greater than the predetermined level, in one embodiment it means that the DAC value is lower than the actual analog magnitude of the input signal, and the trial DAC bit is to be latched and retained. If the DAC value is higher, the DAC bit value is changed to an opposite logic level, e.g. logic level "1" to logic level "0", and this reversed state is latched and retained. Whether for a given bit ($e_{in} - I_{DAC}$) is above or below the level set by comparator 42 is represented by the logic level of a signal over line 58 which controls the latch associated with the register bit. The state of this bit dictates whether to retain the original state of the corresponding register bit, or to reverse it. At the end of one cycle of the register, a signal over line 60 causes control unit 14 to produce a signal over line 52 which activates tri state buffer 50. Tri state buffer 50 then reads out the state of the successive approximation register, thereby providing a digital number which approximates the magnitude of the input signal to the analog-to-digital converter. Voltage comparator 48 may be strobed or actuated just prior to register 10 clocking, thereby to prevent characteristic oscillations of comparator 48 from developing. Control unit 14 provides a signal on line 56 to reset register 10 and to restart the cycle when a new start convert signal is received.

Equal Current DAC

Prior to describing the operation of the current comparator which permits the utilization of low current drain C-MOS switching circuitry without loss of speed, the following describes the transient-free, high accuracy C-MOS DAC and more particularly, the equal current portion thereof.

The conventional R, 2R network produces binary weighted currents in accordance with a binary switching scheme keyed to the binary outputs of the successive approximation register. The R, 2R network may be utilized for the less significant bits simply because accuracy in this domain is of less criticality. Were it desirable however, the entire digital-to-analog converter could be made up of equal current generating resistors such as illustrated at 38. These resistors produce equally weighted incremental currents as a result of the decoding of the binary outputs of the more significant bits of the successive approximation register.

The differences between the equal current DAC and the conventional R, 2R DAC are first that it includes a different type of resistor network which is one in which resistors, each having the same weight, are connected in parallel by corresponding switches between a reference voltage and an output bus.

Secondly, the binary input code is converted to a specialized code for the actuation of the switches for the network. Here the binary input code is converted into a code in which an increment in the binary number results in the adding in parallel of an additional resistor to the remainder of the resistors already connected between the reference source and the output bus.

This system has two advantages. As mentioned before, the first advantage is that no one resistor contributes more than its fractional part of the total resistance network to error. Thus if four bits are decoded, involving fifteen different resistors, then each resistor contributes no more than one-sixteenth of the total full scale current. Therefore its errors contribute less error at the output than the conventional binary weighted network. This means that in order to obtain a 0.0008% accuracy DAC, no resistor need have an accuracy exceeding 0.0128%, which is almost an order of magnitude less accuracy than that for a corresponding R, 2R ladder. This is because in the R, 2R networks resistors can contribute as much as half the error for the most significant bit.

Secondly, because of the decoding of the binary input code and the manner in which the resistor elements are added in parallel, there is no situation in which one switch is to be turned ON while another switch is to be "simultaneously" turned OFF for any incremental input code change. This means that only one switch in fact changes state for an incremental change in input code. Thus no "glitch" occurs for any incremental change in input code.

How the R, 2R ladder can produce "glitches" is now described. In the case of an R, 2R ladder for binary input code 0000, all of the switches connect their respective resistors to ground. A "one" in the code indicates that the particular switch involved switches the respective resistor from ground to the output bus. The most troublesome transition of the binary code is one in which a transition, for instance, at half scale, is required. In this case, with the most significant bit ON and the other bits OFF, the change requires that the most significant bit be turned OFF and all of the rest of the bits be turned ON, e.g. going from code 1000 to code 0111. Because of the differential in switching speeds, it takes longer for the least significant bit switches to switch ON versus the time it takes for the most significant bit switch to be turned OFF. Thus there is in essence an intermediate state of 0000 when switching from 1000 to 0111. This results in a transient in the output voltage in which in going through the transition, a downwardly projecting spike occurs. This is one type of glitch which is associated with R, 2R ladders.

Figure 13:
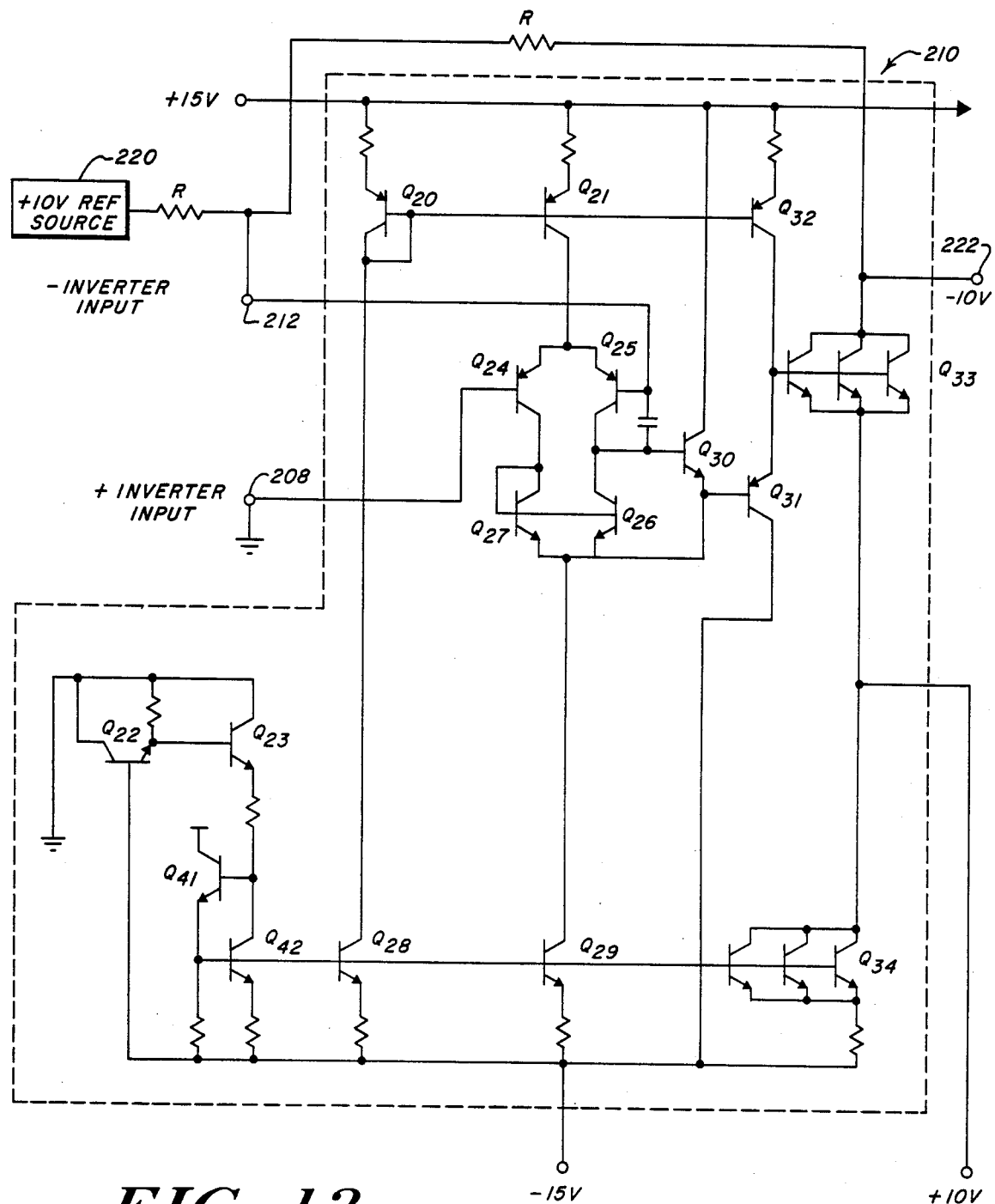

Referring again to FIG. 1, switches 36 may be controlled by a decoder and latch circuit such as illustrated in FIG. 13. The decoder translates a binary output code into the specialized code utilized to develop incremental currents. As discussed in connection with FIG. 13, a particular input is being decoded and latched until such time as a readout signal is applied to the latch circuit, whereby all switches are actuated at one time. The aforementioned switches are actuated in accordance with the following truth table:

TABLE I

| Decoder Input | | | Decoder Output |
|---|---|---|---|
| $2^{-1}$ | $2^{-2}$ | $2^{-3}$ | Outputs to Current Switches |
| 0 | 0 | 0 | 0000000 |
| 0 | 0 | 1 | 0000001 |
| 0 | 1 | 0 | 0000011 |
| 0 | 1 | 1 | 0000111 |
| 1 | 0 | 0 | 0001111 |
| 1 | 0 | 1 | 0011111 |
| 1 | 1 | 0 | 0111111 |
| 1 | 1 | 1 | 1111111 |

Figure 12:
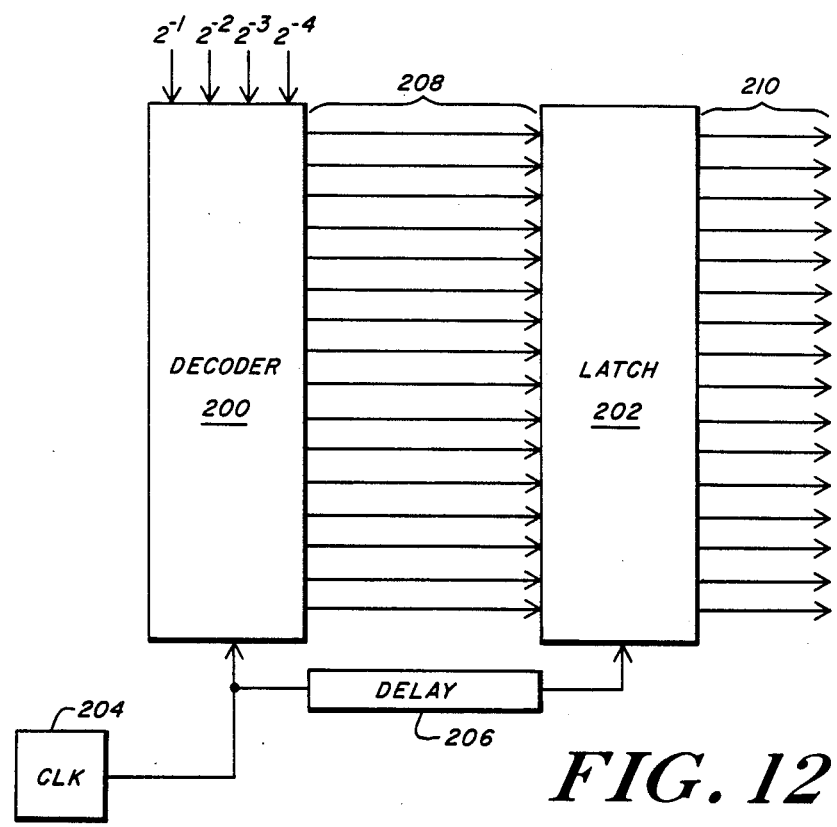
FIG. 12 is a block diagram illustrating the interposition of a latch circuit between the decoder of FIG. 1 and the switches for the equal current resistor network of FIG. 1; and, FIG. 13 is a schematic diagram of an inverter for utilization by the successive approximation analog-to-digital converter of FIG. 1, illustrating a single amplification stage and a bootstrap circuit.

A decoder circuit which follows the truth table of Table I is illustrated in FIG. 12 and will be described hereinafter.

It will be appreciated that the accuracy of the overall analog-to-digital conversion depends on the accuracy of the digital-to-analog conversion. The accuracy of the digital-to-analog conversion is in turn dependent upon the accuracy of the resistor network utilized to form the equal currents and also on the switching characteristics of the switches utilized to connect the equally weighted resistors to an output bus. What has therefore been provided is a transient-free, high accuracy digital-to-analog converter. When switches 36 are of the aforementioned C-MOS variety, not only is a transient-free, high accuracy digital-to-analog converter provided, but also one in which current drain is minimized.

Current Comparator

As mentioned hereinbefore, it is a characteristic of C-MOS switching circuits that the output capacitance is relatively high. Thus when operated in a voltage mode, the associated switching capacitance precludes the utilization of a C-MOS switching where switching speed is a factor. By operating in the current mode, and by providing a current comparator which has a zero input impedance, the effect of the high capacitance output for C-MOS devices is eliminated and C-MOS switching devices can, in fact, be utilized without any deleterious speed reductions.

Referring back to FIG. 1, it will be appreciated that the current comparator of the subject invention involves the utilization of a current-to-voltage converter and a voltage comparator. Conventional voltage comparators are exceptionally complex and have an exceedingly high parts count making them relatively expensive. The relatively high parts count and expense is due primarily to the efforts at providing gain with speed. As will be discussed, several embodiments of the subject current-to-voltage converter not only have zero input impedance, but also have current-to-voltage gains greatly in excess of one, which permits the utilization of a relatively simple voltage comparator with a reduced parts count. As will also be discussed, techniques will be described which provide the current-to-voltage converter with gains well in excess of one without a concomitant reduction in speed.

Figure 2:
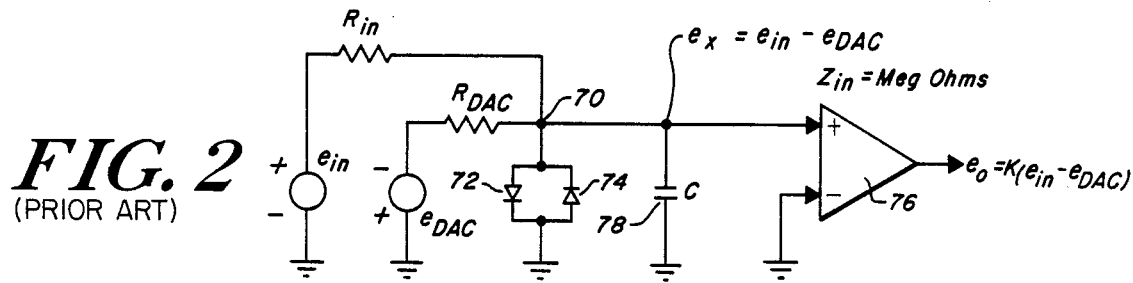
FIG. 2 is a schematic diagram illustrating a prior art voltage comparator illustrating a high impedance input node for the comparator.

Referring now to FIG. 2, if the DAC were to be operated in the voltage mode or domain, the DAC-generated voltage across $R_{DAC}$ would be compared at node 70 to the input-generated voltage across $R_{in}$. This voltage would be referenced to ground via back-to-back diodes 72 and 74. The voltage at point 70, $e_x = -K_o(e_{in} - e_{DAC})$ is applied to the non-inverting input terminal of a comparator 76 having its inverting input terminal grounded. If comparator 76 has an input impedance to ground characterized by capacitor 78, which capacitance is relatively large, the speed of the circuit is greatly reduced. It will be appreciated that the output voltage from amplifier 76 is $e_0 = K(e_{in} - e_{DAC})$.

Figure 3:
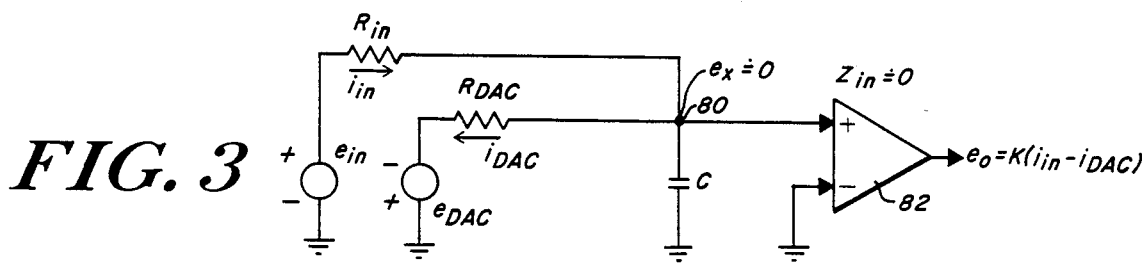
FIG. 3 is a schematic diagram of the subject current comparator, illustrating a zero input impedance node.

Referring to FIG. 3, the system converter operates with a DAC voltage $e_{DAC}$, a current $i_{DAC}$ flowing as illustrated through $R_{DAC}$, and with an input voltage $e_{in}$ and current flowing through input resistor $R_{in}$ resulting in a current $i_{in}$ as illustrated. In the subject system the voltage $e_x$ at point 80 is approximately equal to zero, resulting in a zero input impedance $Z_{in}$. Note that converter 82 has one of its input terminals coupled to input node 80 and other of its input terminals grounded. In this case, the output of the converter $e_0$ is $K(i_{in} - i_{DAC})$. Because the input impedance is very low and in parallel with C, this circuit is much faster than the FIG. 2 configuration.

Figure 4:
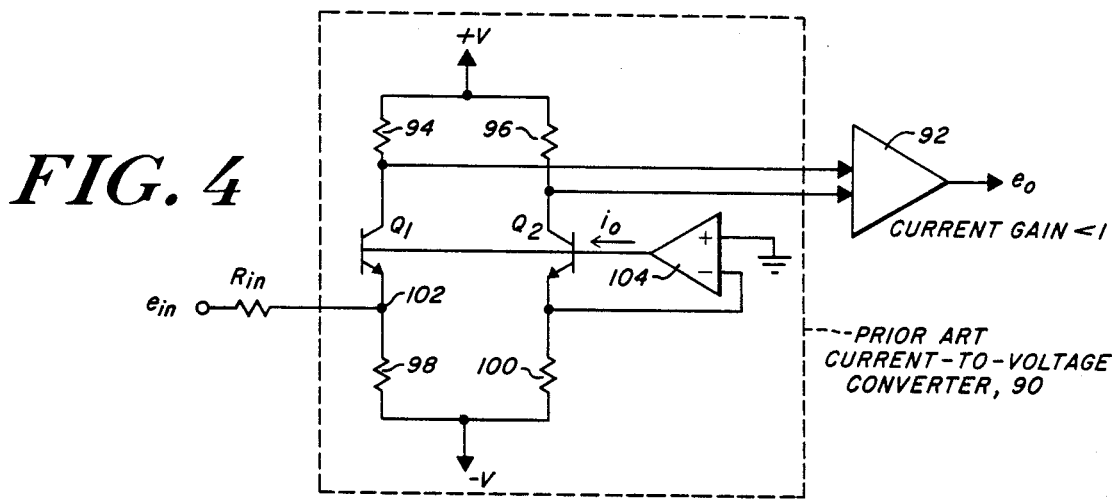
FIG. 4 is a schematic diagram of a prior art current-to-voltage converter utilized in conjunction with a conventional voltage comparator in which the voltage gain for the input circuit is less than one.

Referring to FIG. 4, a prior art current-to-voltage converter 90 is coupled to a conventional voltage comparator 92. Transistors Q1 and Q2 are respectively coupled between V+ and V− via collector resistors 94 and 96 and emitter resistors 98 and 100. Assuming $e_{in}$ applied through resistor $R_{in}$ to node 102 and further assuming an operational amplifier 104 for providing a biasing current $i_0$ to the bases of transistors Q1 and Q2 as shown, then point 102 can be initially biased to zero volts while providing a zero input impedance node.

In operation, with matched components, and assuming no input signal is applied to the emitter of transistor Q1, the current from V− to V+ through resistor 98, transistor Q1 and resistor 94 matches the current through resistor 100, transistor Q2 and resistor 96. It is the function of the operational amplifier to sense the voltage at the emitter of transistor Q2 and to drive the bases of transistors Q2 and Q1 in a negative feedback fashion, so as to force the voltage at the emitter of transistor Q2 to zero. This is accomplished because the non-inverting input to the operational amplifier is grounded and because the inverting input to the operational amplifier is coupled to the emitter of transistor Q2. It is the function of the operational amplifier in this circuit to reduce the difference in voltage at its input terminals to zero. Since one of its input terminals is grounded, the feedback circuit changes the voltage on the base of transistor Q2 in a direction to drive the emitter of transistor Q2 to the voltage established by the non-inverting input. Since the output of the operational amplifier drives not only the base of transistor Q2, but also the base of transistor Q1, the voltage at the emitter of transistor Q1 is likewise driven to zero, assuming matched components for the system. If an input signal is applied to the emitter of transistor Q1, the current added by the signal flows through transistor Q1 and resistor 94 to V+. The difference in current between transistors Q1 and Q2 appears as a voltage differential at the collectors of transistors Q1 and Q2, with the voltage at the collector of transistor Q1 being a function of the current through transistor Q1 times a factor established by resistor 94. The collector of transistor Q1 follows the input signal almost instantaneously so that what is established by current-to-voltage converter 90 is a perfect d.c. grounded base stage, the output of which instantaneously follows the input. Note that the input signal is not applied to the emitter of transistor Q2, because operational amplifier 104 would respond to the input signal with a relatively slow recovery time. Thus, biasing of the input node to zero volts is accomplished by a negative feedback circuit which is isolated from the input signal. This permits the current-to-voltage converter to react almost instantaneously to changes in the input signal, thereby providing the requisite speed for this circuit.

However, in order to accommodate overload currents, the resistor values for resistors 94 and 96 must be low and thus the gain of the current-to-voltage converter 90 will, in general, be low. The reason for the low voltage gain will be seen from considering, for instance, that the total input current from the DAC may be on the order of two mlliamps. This much current constitutes an overload condition in which one or both of the transistors will turn off. In order to prevent the turning off of transistors Q1 and Q2, commonly known as input lift, two mils or greater of current must be provided through transistors Q1 and Q2. In the aforementioned example, assume that 100 microamps is running through transistors Q1 and Q2, if one were to develop two mils of input current of the appropriate polarity, one or the other of the two transistors would turn off and all of the input current would flow either through resistor 98 or resistor 100. In order to prevent this, the biasing current $i_0$ must at least equal the maximum overload current. This requires that resistors 94 and 96 have relatively low values. Low values result in low gain. Thus, while it is possible with the circuit of FIG. 4 to obtain a low input impedance, the gain of the current-to-voltage converter is less than one when referred to the input, $e_{in}$. The voltage comparator thus has less signal available to it than it would have have had, had the DAC been operated in the voltage mode and coupled directly to the inputs of the voltage comparator. In summary, in order to solve the overdrive problem, low collector resistor values are necessary which defeats the purpose of having a current-to-voltage converter stage.

Another problem with the circuit of FIG. 4 and overcurrents, is the problem of non-perfect transistors. Were transistors Q1 and Q2 identical, having identical characteristics, then no matter what the biasing current utilized to keep them in conduction, there would be no error or difference in current between the two halves of the circuit referred to the input. However, transistors Q1 and Q2 will never be identical and since they operate in a push/pull fashion, any difference in characteristics of the two transistors are magnified to the extent of the use of high biasing currents $i_0$. What occurs in the case of non-identical transistors is that an error current is referred to the input that is some percentage of the bias current $i_0$. Reducing the amount of bias current reduces the amount of error current referred to the input and is thus exceptionally beneficial.

Reduced Bias Current Converter with Unity Gain

Figure 5:
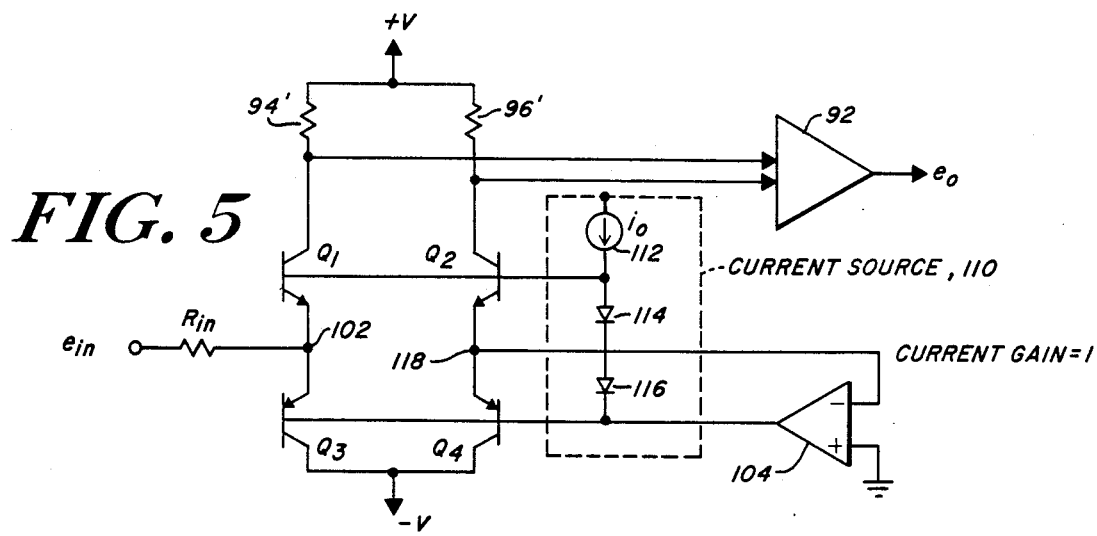
FIG. 5 is a schematic diagram illustrating one embodiment of the subject current-to-voltage converter utilized in combination with a conventional voltage comparator in which the gain of the current-to-voltage conversion stage is greater than one.

In order to reduce the level of bias current necessary, thereby to permit the utilization of high valued collector resistors so as to achieve high gain through the current-to-voltage converter stage, referring to FIG. 5, a pair of transistors Q3 and Q4 are connected between the emitters of Q1 and Q2 and V− so as to provide an overdrive shunt. These transistors replace resistors 98 and 100 of the circuit of FIG. 4 and are biased by a current source 110 comprised of a current source 112 and two diodes 114 and 116, in which the anode of diode 114 is coupled to the bases of Q1 and Q2. Operational amplifier 104 has its output connected to the bases of transistors Q3 and Q4, with its inverted input terminal coupled at 118 to the emitter of transistor Q2, the non-inverted input to operational amplifier 104 being grounded. In operation, the emitter of transistor Q2 is maintained at zero volts through feedback to the bases of transistors Q3 and Q4. Diodes 114 and 116 reference the bases of transistors Q1 and Q2 two diode drops above the bases of Q3 and Q4 such that the biasing of transistors Q1 and Q2 mirrors that of transistors Q3 and Q4. In this case, $i_0$ is a low quiescent current much less than the aforementioned two milliamps required for overcurrent protection for the circuit of FIG. 4.

When the input current at node 102 goes positive, for instance at two milliamps, Q3 turns on and operates as an overdrive shunt circuit which allows the current to flow directly into the minus supply so that transistor Q1 may be maintained in the conducting region to provide the low input impedance. If the input voltage goes negative so that two mils is pulled out of node 102, then transistor Q4 is turned on. Simultaneously, transistor Q1 balances and acts as a positive supply. Thus both Q1 or Q2 will always be conducting, thereby to provide a low input impedance node and this is established without having to provide a high quiescent current. The low quiescent current is that established at current source 112. In the circuit of FIG. 5, it is possible to drop from two mils quiescent current to fifty or less microamps while still being able to accommodate a two mil overload. Moreover, the error current referred to the input caused by mismatches in transistors Q1 and Q2 are now a percentage of fifty microamps, as opposed to being a percentage of two milliamps.

Figure 6:
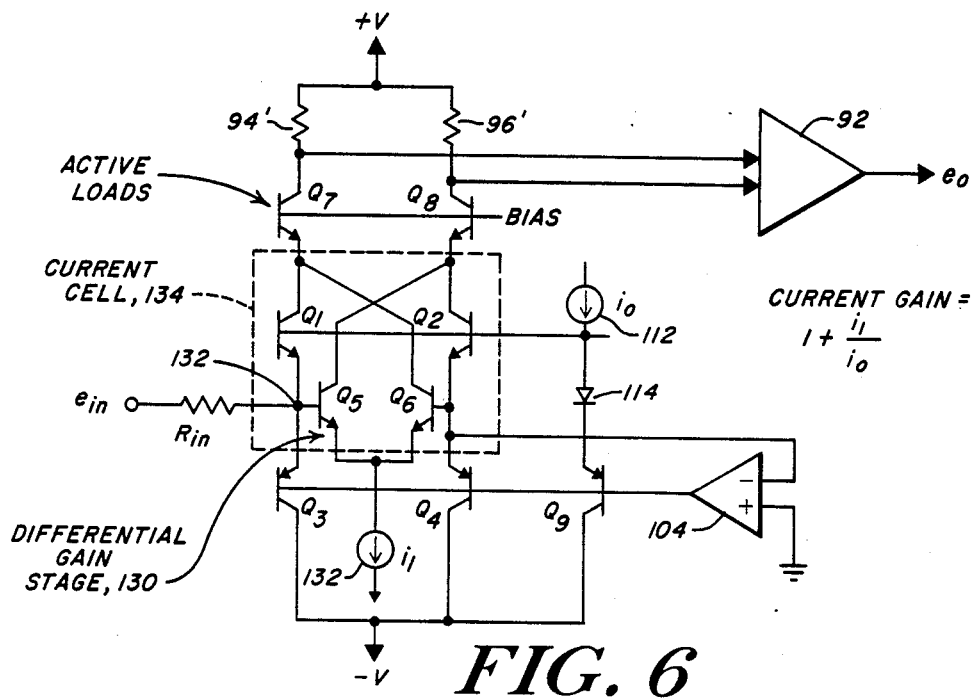
FIG. 6 is a schematic diagram of another embodiment of the subject current-to-voltage converter illustrating the utilization of current cells in a differential gain stage in combination with active loads to further increase the gain of the current-to-voltage stage without introducing large time constants.

In order to increase the current gain of the current-to-voltage converter, referring now to FIG. 6, a differential gain stage 130 is coupled across transistors Q1 and Q2 and comprises transistors Q5 and Q6 having their bases respectively coupled to the emitters of Q1 and Q2, with the emitters of Q5 and Q6 being interconnected and coupled to a supplemental current source 132 which generates "tail" current. The effect of the utilization of the differential gain stage comprised of transistors Q5 and Q6 is that small signals that appear at input node 132 are amplified and converted to currents in the collectors of Q5 and Q6. These currents are added to the current that originally appears at the collectors of Q1 and Q2 so that a gain equal to $i_1$ (the tail current) divided by $i_0$ is added to the unity current gain. Thus, the current gain is controlled by the tail current and the original input bias current. The basic building block involving transistors Q1 and Q2 and Q5 and Q6 is called a current cell, here illustrated at 134.

The differential gain stage not only increases the current gain of a system, the current cell in combination with transistors Q3 and Q4 preserves the ability to reduce error and accommodate large current swings unlike prior art systems.

As illustrated at the top portion of FIG. 6, grounded base stages comprising transistors Q7 and Q8 are added as active loads so that the collectors of Q5, Q6, Q1 and Q2 are not required to change voltage levels. This preserves the speed of the original circuit in that the two grounded base transistors allow the current that has been amplified to go directly on into the collector load resistors 94' and 96'. It will be appreciated that this solves the problem of voltage gain versus speed. Because of the high current gain, what is provided is a high voltage gain at the collector load resistors. This provides significant amounts of overdrive to a conventional voltage comparator.

Referring to the biasing for transistors Q1, Q2, Q3 and Q4, the non-inverting input of operational amplifier 104 is coupled to the emitter of transistor Q2, with the non-inverting input coupled to ground. The output of operational amplifier 104 is used to drive some point which can raise the input stages up or down with respect to ground. This essentially biases the emitter of transistor Q2 in all cases to whatever the voltage offset of the operational amplifier is. This sets the operating point on the input node and allows it to be set at zero or near zero volts. Note that the output of the operational amplifier is utilized to drive the bases of transistors Q3, Q4 and Q9, with transistor Q9 having been substituted for diode 116 of FIG. 6. Note also that the operational amplifiers described in FIGS. 4, 5 and 6 do not have to be exceedingly fast devices and, in fact, function merely as a d.c. biasing device.

Figure 8:
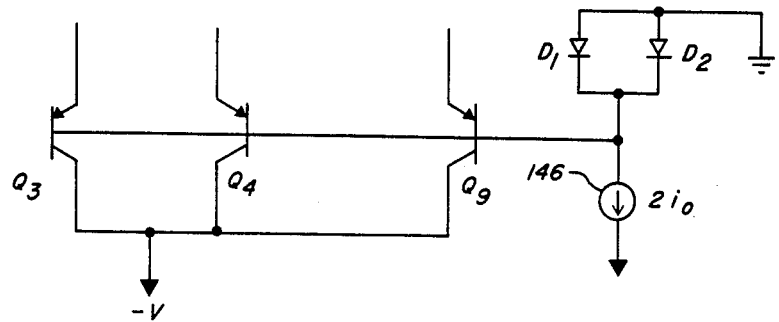
FIG. 8 is a schematic diagram illustrating an alternative biasing circuit for use with the current-to-voltage converters of FIGS. 5, 6 and 7.
Figure 9:
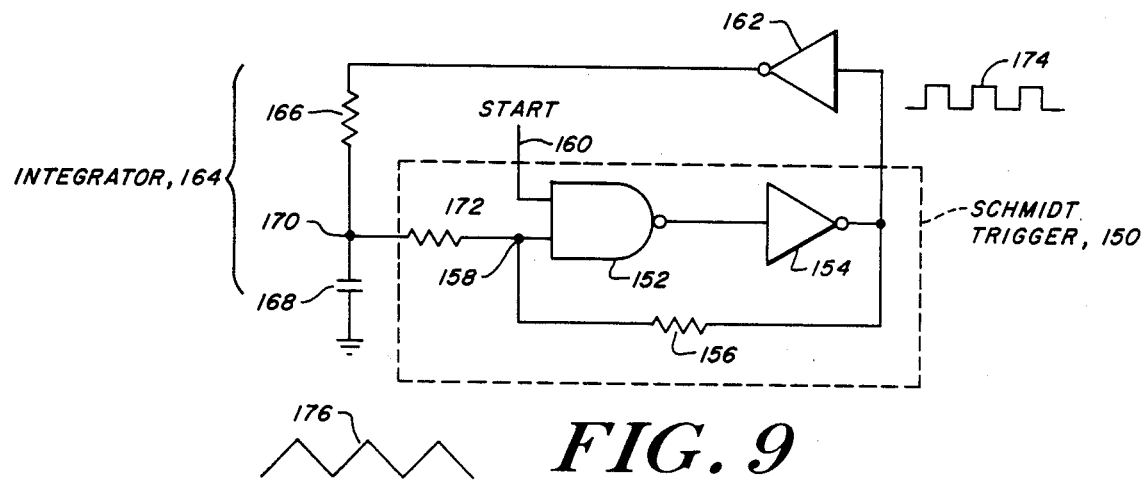
FIG. 9 is a schematic diagram of a C-MOS clock circuit which is temperature insensitive and utilizes a Schmidtt trigger circuit having a sliding hysteresis window.

With respect to the substitution of transistor Q9 for diode 116, it will be appreciated that transistors Q3 and Q4 are PNP transistors. Because it is desirable to fabricate the circuit with monolithic techniques, one choice is to use lateral PNPs for transistors Q3, Q4 and Q9. As to the diodes of FIG. 5, one would be equivalent to an NPN transistor diode-connected, and the other one would be equivalent to a PNP transistor diode-connected. Since diode 116 is equivalent to a PNP transistor, it is desirable from a manufacturing point of view to create the equivalent of diode 116 at the same time that transistors Q3 and Q4 are fabricated. It will also be appreciated that although transistors Q3, Q4 and Q9 could be fabricated as lateral PNPs, it would be possible to utilize vertical PNPs in the fabrication of Q3, Q4 and Q9, which would increase the speed of the overall device. While ordinarily one cannot make a diode out of a vertical PNP, in the circuit configuration of FIG. 6 a vertical PNP may be utilized because the collector of the vertical PNP is connected to the most negative voltage. This accomplishes the diode biasing desired since the $V_{be}$ of transistor Q9 precisely matches the $V_{be}$ of transistors Q3 and Q4. The reason that the use of a vertical PNP for Q9 is important will be discussed in connection with FIG. 8. In FIG. 8, the operational amplifier can be eliminated through the use of one or more PNP diode-connected transistors, while at the same time providing biasing which maintains the input node at zero volts. In short, the reason for the use of vertical PNP transistors is that all the transistors can be manufactured in a single monolithic process, and that the speed of the circuits will be commensurate with the speed of NPN transistors.

Figure 7:
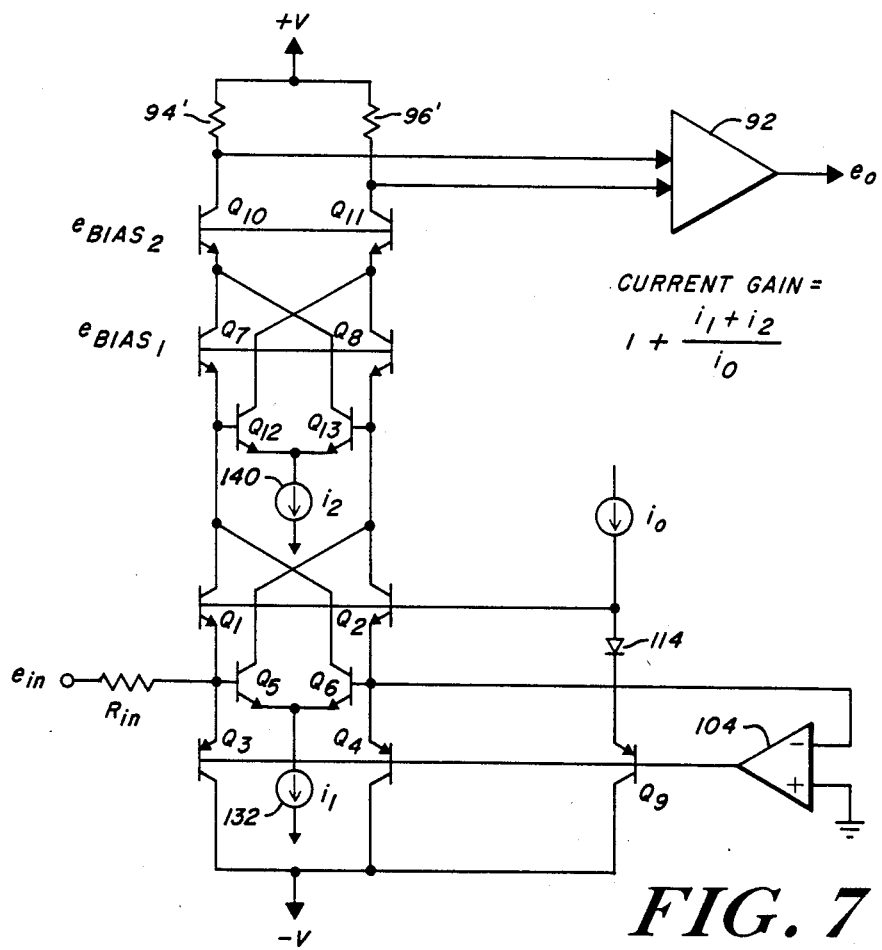
FIG. 7 is a schematic diagram of a still further embodiment of the subject current-to-voltage converter illustrating the utilization of multiple current cells to further increase the current gain of the current-to-voltage conversion stage.

Referring now to FIG. 7, the current-to-voltage converter may be provided with additional current cells and therefore additional differential gain stages in the form of transistors Q12 and Q13, along with active loads established by transistors Q10 and Q11. It will be appreciated that transistors Q10 and Q11 are connected between transistors Q7 and Q8 and load resistors 94' and 96' respectively. Thus, the emitter of Q10 is coupled to the collector of Q13, whereas the emitter of transistor Q11 is coupled to the collector of transistor Q12. The emitters of transistors Q12 and Q13 are tied together and coupled to a current source 140 which develops a current $i_2$. It will be noted that the bases of transistors Q12 and Q13 are respectively coupled to the collectors of transistors Q1 and Q2. Moreover, the bases of transistors Q10 and Q11 are interconnected and connected to an appropriate bias supply. With respect to the current gain, the current gain with the additional current cell is $1+(i_1+i_2)/i_0$.

The purpose of cascading current cells in a current-to-voltage comparator is, in summary, both to provide adequate signal for the follow-on voltage comparator and to provide for an extremely fast current-to-voltage conversion. Note that normal voltage comparators provide a logic level "1" signal for voltages above a predetermined threshold and a logic level "0" signal for voltages below a predetermined threshold. These comparators normally have a problem when the input voltage drops below 5 millivolts due to the functional characteristics in transconductance of the transistors utilized in the voltage comparator. However, in a 12 bit, 10 volt analog-to-digital converter a least significant bit is usually 2½ millivolts. It is generally desirable that the input signal sensitivity to the analog-to-digital converter be a quarter of that, so that conventionally the voltage comparator is to be driven with less than a millivolt. However in a conventional voltage comparator with less than a millivolt of drive, it no longer meets the requisite speed specifications because of the inability to rapidly charge its capacitors with such a low voltage.

More particularly, almost all commercially available voltage comparators are specified at 5 millivolts of drive. This means that if a very large negative input signal is provided to the comparator, its output will be in one logic state. Now if an input signal comes up through ground to +5 millivolts, how fast the output of the converter will switch under these conditions determines the switching time. However, if the signal at the input to the analog-to-digital converter were 100 microvolts and this could be translated to 5 millivolts of drive to the voltage comparator, one could not obtain the requisite speed through the voltage comparator with small input signals.

Put alternatively, using the current cell approach, until the signal gets to the collectors which drive the voltage comparator, there is essentially no voltage movement. All the amplification is gained by current drive which yields a high gain with a low time constant. Although there is a time constant associated with going into the voltage mode at the aforementioned collectors because of the necessary voltage movement, there is only one time constant. Thus, a large amount of gain is developed with only one time constant. In comparison with a conventional voltage comparator, by the time enough gain has been achieved, two or three voltage gain stages are utilized. This provides two or three time constants which not only reduces the speed with which the network can operate, but also provides for an extremely serious oscillation problem because of feedback on the circuit boards, mainly because the devices are physically located next to each other.

Thus in the subject system, very high gain is achieved without utilization of multiple voltage gain stages and resulting a.c. instability. Since there is no voltage change required to achieve a large current gain, when converting from current-to-voltage with two collector resistors, this is the only point at which a dominant time constant is generated. To achieve the same results with cascaded voltage stages, two or three time constants would be involved.

Any speed problems associated with the operational amplifiers of FIGS. 4–7 may be eliminated by the substitution, as illustrated in FIG. 8, of diodes D1 and D2, and current source 146 for the operational amplifier and the feedback circuit associated therewith. It will be appreciated that the anodes of diodes D1 and D2 are grounded and that the cathodes are coupled to current source 146 and also to the bases of transistors Q3, Q4 and Q9.

In operation, if diodes D1 and D2 are PNP diode-connected tranistors and assuming that they match transistors Q3, Q4 and Q9, and assuming current source 146 develops a current $2i_0$, then diodes D1 and D2 carry equal currents. By virtue of the voltage drop across the diodes, the cathodes of diodes D1 and D2 are at $-0.7$ volts. Since transistors Q3, Q4 and Q9 have a base-emitter voltage drop of 0.7 volts, the emitters of transistors Q3 and Q4 are essentially biased to zero volts.

The reason for the utilization of two diodes is as follows. It will be appreciated that one diode and a current source equal to $i_0$ could have been utilized. However, because of the speed problems associated with finite $\beta$, doubling the value of the current source provides more base drive for transistors Q9, Q3, and Q4. Doubling the base drive for transistor Q9 improves overdrive recovery time. More diodes in parallel further reduces the problem.

System Clock

For the normal type of clocks utilized in C-MOS analog-to-digital encoding, the clock frequency is a function of threshold voltage of the logic that is used in the clock. This is undesirable because it is extremely advantageous to have the clock frequency fairly stable with temperature so that the overall analog-to-digital conversion time stays within some reasonable limits. In order to provide a clock, the frequency of which is essentially independent of threshold voltage, so that from lot to lot or with temperature the clock frequency does not change as the threshold voltage of the C-MOS logic shifts, a Schmidtt trigger 150 is provided which includes a NAND gate 152 and an inverter 154, the output of which is fed back via resistor 156 to one input terminal 158 of NAND gate 152. The other input terminal of NAND gate 152 is coupled via line 160 to a START signal. The output of the Schmidtt trigger is inverted at 162 and is applied to an integrator 164 comprised of resistor 166 and capacitor 168, coupled between the output of inverter 162 and ground. A midpoint 170 is coupled via resistor 172 to input terminal 158 of NAND gate 152.

In operation, Schmidtt trigger 150 establishes a hysteresis level somewhere under power supply limits. The Schmidtt trigger is driven by integrator 164, with the input to the integrator being square wave output 174 of the Schmidtt trigger. The output of the integrator is therefore a triangular wave 176, with the triangular wave driving the Schmidtt trigger. The circuit operates such that when the output of the integrator arrives at the upper level of the Schmidtt trigger, the polarity of the integrator input reverses. This starts the output of the integrator down until it arrives at the lower level of the Schmidtt trigger. At this point the input to the integrator reverses and the integrator integrates back up the upper level. The difference between the upper and lower levels establishes the hysteresis of the Schmidtt trigger. The hysteresis level is determined by power supplies and resistor ratios and the time it takes to integrate from the lower level to the upper level is therefore always determined by the rate the capacitor and the resistor in the integrator operate, coupled with the voltage swings between the two levels. Since the two levels will always be spaced apart by a predetermined amplitude, the clock rate will always be the same even though the thresholds of the logic gates shift up and down.

Network Trimming

Figure 10:
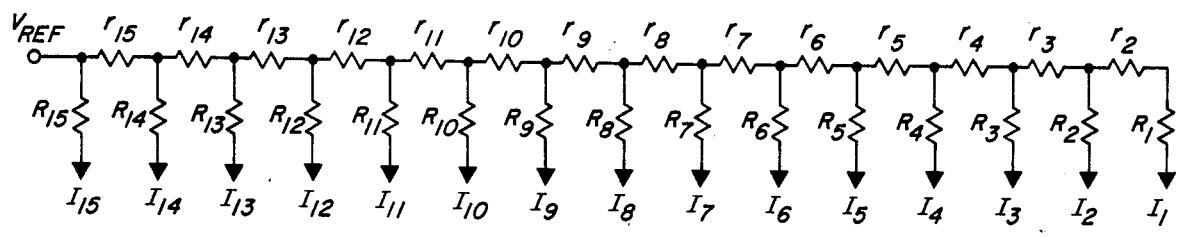
FIG. 10 is a schematic diagram of a resistor network for providing equal currents in which trimming resistors are interposed between main resistor elements in order to initially adjust the values of the equal currents for the network.

It is possible to correct for over-trimming of a given resistor in resistor network 38 of FIG. 1 without retrimming other resistors through the utilization of the resistor network in FIG. 10. In this network, resistors $R_1$ through $R_{15}$ are equally weighted and, as can be seen resistors $r_2$ through $r_{15}$ interconnect the resistors $R_1$ through $R_{15}$. The resistor ladder shown in FIG. 10 is arranged such that the currents generated by resistors $R_1$ through $R_{15}$ are equal. Thus $I_1 = I_2 = I_3 \ldots = I_{15}$. This may be accomplished by giving the resistors the values shown in Table II.

TABLE II

| Kohms | | Ohms | |
|---|---|---|---|
| $R_1$ | 66.666 | $r_2$ | 294.167 |
| $R_2$ | 67.255 | $r_3$ | 197.5 |
| $R_3$ | 67.849 | $r_4$ | 150 |
| $R_4$ | 68.447 | $r_5$ | 120.833 |
| $R_5$ | 69.051 | $r_6$ | 101.666 |
| $R_6$ | 69.661 | $r_7$ | 87.5 |
| $R_7$ | 70.276 | $r_8$ | 77.5 |
| $R_8$ | 70.896 | $r_9$ | 69.166 |
| $R_9$ | 71.522 | $r_{10}$ | 63.333 |
| $R_{10}$ | 72.153 | $r_{11}$ | 57.5 |
| $R_{11}$ | 72.790 | $r_{12}$ | 53.333 |
| $R_{12}$ | 73.432 | $r_{13}$ | 50 |
| $R_{13}$ | 74.080 | $r_{14}$ | 46.666 |
| $R_{14}$ | 74.734 | $r_{15}$ | 44.166 |
| $R_{15}$ | 75.394 | | |

Note that only $R_1$ through $R_7$ need be used for the three most significant bits of the subject system, and that they can be combined to produce weights of 2048, 1024, and 512.

It will be appreciated in typical laser trimming operations a mistake most often made is that a given resistor is over-trimmed. Since it is exceedingly difficult to add material to a resistor matrix, with the over-trimming of the particular resistor, all of the other resistors must be trimmed, which means going over the resistor matrix a number of times in order to obtain equal currents.

The system illustrated in FIG. 10 is more easily trimmed while at the same time providing a series of, in this case, 15 equal current sources. Assuming that resistor $R_1$ is appropriately set, then resistor $R_2$ may be trimmed. If resistor $R_2$ is over-trimmed it is possible to remove material from resistor $r_2$ such that the current running from $V_{ref}$ to $R_1$ is reduced to the point that $I_2 = I_1$.

The resistor network is trimmed from at least significant bit ($R_1$) to the most significant bit ($R_{15}$) such that if for instance $R_6$ is over-trimmed, resistor $r_6$ is trimmed such that all currents to the right $I_6$ (e.g. all less significant bits) equal that of $I_6$. For instance, if $R_1$ through $R_5$ are trimmed so as to provide 15 milliamp current sources, and if $R_6$ is over-trimmed such that $I_6$ is only producing 14 mils of current, then $r_6$ may be trimmed such that $I_1$ through $I_5$ now produce currents of 14 mils.

This process is repeated until the entire ladder is trimmed to a point of producing equal currents.

It will be appreciated that the desired result is to have a maximum in the ratio between the main resistors and the trimming resistors and in some cases this may be 1000 to 1. On the other hand, it is important to minimize the voltage drop from $V_{ref}$ to the junction of $R_1$ and $r_2$. This is an engineering trade off. Note, ratios of between 100 to 1 and 1,000 to 1 produce acceptable results.

What will be appreciated is that, when trimmed in this manner, the trimming resistors permit easy adjustment for the current sources to the right of the resistor which is over-trimmed. Thus, only one trimming resistor need be trimmed to adjust the entire network for a given over-trimming situation.

Decoder and Latch Circuits

Figure 11:
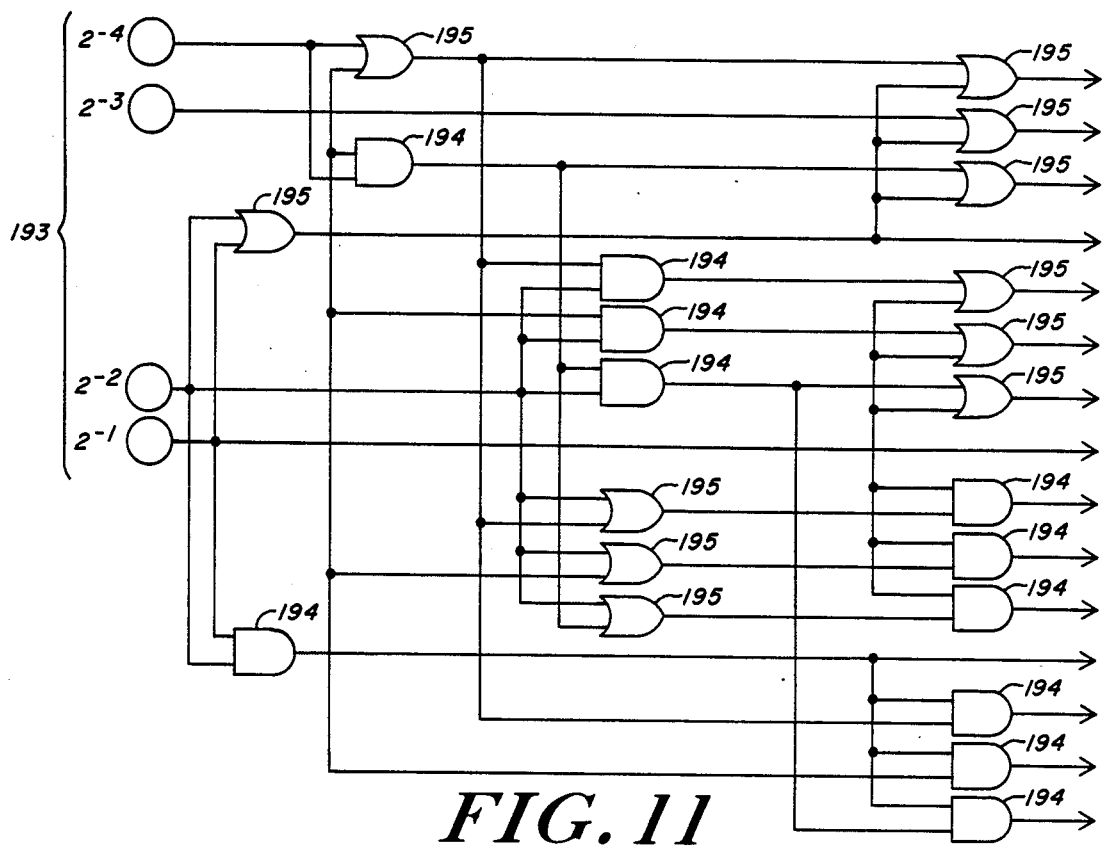
FIG. 11 is a schematic diagram of a switching circuit utilized for converting the output of the successive approximation register of FIG. 1, so as to provide switching signals for the switches of the equal current DAC of FIG. 1.

A decoder which performs the functions described in the aforementioned truth table is described in connection with FIG. 11, in which binary inputs at 193 are decoded by AND gates 194 and two OR gates 195 in accordance with the truth table of Table I.

Referring now to FIG. 12, a decoder and latch circuit are schematically illustrated. It is the purpose of the decoder to decode the binary input code as described in accordance with the aforementioned table. It is the purpose of the latch circuit to store the decoder outputs until the latch circuit is actuated by a clock pulse. The latching outputs are then read out all at one time.

As illustrated in FIG. 12, a decoder 200 is connected to a latch circuit 202 and is clocked by a clock 204, with a delay 206 being interposed between the decoder and latch circuit.

Upon the occurence of a clock pulse, decoder 200 decodes the binary input code and produces logic level signals on output lines 208. In the decoding, there is a possibility that the output signals on lines 206 will not reach the desired logic level signal in a synchronous manner. Latch 202 is therefore interposed so that the output signals on 208 are sampled and held until such time as a clock pulse from delay unit 206 actuates the latching circuit so as to dump the contents of the various sample and hold circuits onto output lines 210. Since this is done all at one time, the switches in the switching matrix are actuated simultaneously thereby reducing switching transients to an absolute minimum. Latch circuits are conventional and are not described herein. Note, the successive approximation register serves as the latch in FIG. 1. This occurs prior to decoding.

High Gain Inverter

As mentioned hereinbefore, it is important to provide a reference voltage source involving a high gain inverter which is d.c. stable. To provide d.c. stability it is important to obtain the requisite gain, typically 50,000, in one stage.

In the general operation of the reference supply 28 of FIG. 1, this supply is provided with a +10 volt reference source and an inverter which inverts the 10 volts so as to provide a −10 volt reference. The inverter is an exceptionally high gain operational amplifier in which the gain is provided in a single stage by an active load which is bootstrapped. Referring to FIG. 13, the non-inverted input 208 to an operational amplifier 210 is grounded and the inverter input 212 to the operational amplifier is coupled to the +10 volt reference source 220 through a resistor R. This terminal is also coupled to the output 222 of the operational amplifier by an identical resistor R. Assuming that the resistor between the 10 volt reference supply and the inverting input to the operational amplifier initially drops the voltage to, for instance 5 volts, while initially the output of the operational amplifier is at zero volts, the output of the operational amplifier begins to drop. The output drops until it reaches −10 volts at which point the voltage at the inverting input terminal is zero, thereby matching the voltage at the grounded non-inverting input terminal. The gain of the operational amplifier is relatively high, and in one embodiment is 50,000. The manner in which this inverter is implemented is now described.

The input stage of the inverter involves transistors Q24 and Q25 which form a normal differential amplifier. The transistors utilized in this implementation are PNP transistors in order to generate a minus voltage. Transistors Q26 and Q27 are active loads. It will be appreciated that transistors Q24 and Q25 are the basic input transistors. These transistors are loaded by active load made up of transistors Q27, Q28 and Q30. The combinations of these three transistors to function as an active dynamic load provides a gain of 50,000. Transistors Q31 and Q33 are voltage followers for current power output capability. Transistors Q20, Q21, Q32, Q42, Q22, Q23, Q41, Q28, Q29 and Q36 are current sources for biasing purposes.

More particularly, transistors Q26, Q27 and Q30 form an active dynamic load for the output of transistors Q24 and Q25, and transistor Q30 provides the bootstrapping. The purpose of the bootstrapping is as follows. When utilizing a transistor, assuming that is is perfect, its collector output impedance is infinite. When utilizing a differential input stage, assuming that one utilizes a dynamic or transistor load, the gain theoretically should be infinite. However, in practical circumstances, the gain of such a differential amplifier is limited to approximately 2,000. The reason that it is so limited is that the output impedance of real devices is not infinite. The bootstrap circuit takes the natural output impedance of a dynamic load and amplifies it by the beta of transistor Q30, thereby achieving a gain closer to the ideal infinite value. Thus, gain is provided with a single gain stage through the utilization of a bootstrap circuit. It is the utilization of a single gain stage which minimizes d.c. instability while at the same time minimizing parts count.

In summary, a successive approximation analog-to-digital converter utilizes an improved high-gain current comparator having a zero input impedance characteristic in combination with an equal current digital-to-analog converter. The zero input impedance comparator permits the use of low power C-MOS switching circuitry by leading the output of the digital-to-analog converter to the zero impedance input of the comparator, thereby overcoming the problem of decreased switching speed associated with high impedance C-MOS outputs. The zero input impedance of the comparator is provided by a current-to-voltage converter coupled to a voltage comparator. To increase the gain of the converter for reducing the complexity of the voltage comparator while at the same time maintaining speed, the converter utilizes a number of current cells to boost gain without interposing multiple voltage amplification stages and associated time constants which would ordinarily limit speed. Overdrive shunt transistors are provided in the converter to shunt overdrive currents directly to the minus supply voltage, thus eliminating the necessity of providing high quiescent bias current to prevent transistor cut-off that results in high input impedance. This also permits the utilization of high-valued load resistors to increase gain and reduces the error current associated with high quiescent bias. The equal current digital-to-analog converter provides increased linearity with decreased switching transients. Increased stability is provided by a reference supply which utilizes a single gain stage and a circuit which bootstraps an active load to achieve high gain with minimum d.c. instability. An improved accuracy C-MOS clock is also provided, the freqency of which is made independent of supply voltage through the utilization of an integrator in combination with a Schmidtt trigger having a sliding hysteresis window.

Having above indicated a preferred embodiment of the present invention, it will occur to those skilled in the art that modifications and alternatives can be practiced within the spirit of the invention. It is accordingly intended to define the scope of the invention only as indicated in the following claims.

I claim:

1. A zero input impedance current comparator comprising:
a zero impedance current-to-voltage converter and a voltage comparator, said converter including a first pair of transistors having collectors and having interconnected bases, load resistors coupled between the collectors of respective transistors of said first pair of transistors and a positive voltage source, means for providing a voltage to the bases of said first pair of transistors such that the emitter of one of said first pair of transistors is driven to zero responsive to the voltage at the emitter of said one transistor, means adapted to apply an input signal to the emitter of the other of said transistors, and current shunt means coupled between said emitters and a negative voltage source so as to shunt therethrough increased currents responsive to increased currents through said one transistor, said means for providing a voltage to the bases of said first pair of transistors further including means for controlling said shunt means responsive to said increased currents through said one transistor, said voltage comparator having input terminals coupled to different ones of said collectors of said first pair of transistors.

2. The comparator of claim 1 wherein said converter includes a current source and at least one differential gain stage coupled between said emitters and said current source.

3. The comparator of claim 2 wherein said differential gain stage includes a second pair of transistors having respective bases coupled to the emitters of corresponding transistors of said first pair, having respective collectors coupled to the collectors of different transistors of said first pair, and having emitters coupled to said current source.

* * * * *